US012607690B2

(12) United States Patent
Ikeda et al.

(10) Patent No.: US 12,607,690 B2
(45) Date of Patent: Apr. 21, 2026

(54) METHOD FOR INSPECTING A POWER STORAGE DEVICE FOR SHORT CIRCUIT, METHOD FOR MANUFACTURING THE POWER STORAGE DEVICE, AND METHOD FOR MANUFACTURING A CONNECTED RESTRAINED-DEVICE MODULE

(71) Applicants:Prime Planet Energy & Solutions, Inc., Tokyo (JP); TOYOTA JIDOSHA KABUSHIKI KAISHA, Aichi-ken (JP); PRIMEARTH EV ENERGY CO., LTD., Shizuoka-ken (JP)

(72) Inventors: Hiroaki Ikeda, Toyota (JP); Toshiki Yoneyama, Toyohashi (JP)

(73) Assignees: PRIME PLANET ENERGY & SOLUTIONS, INC., Tokyo (JP); TOYOTA JIDOSHA KABUSHIKI KAISHA, Aichi-Ken (JP); TOYOTA BATTERY .CO., LTD, Shizuoka-Ken (JP)

( * ) Notice: Subject to any disclaimer, the term of this patent is extended or adjusted under 35 U.S.C. 154(b) by 240 days.

(21) Appl. No.: 18/453,325

(22) Filed: Aug. 22, 2023

(65) Prior Publication Data
US 2024/0103095 A1      Mar. 28, 2024

(30) Foreign Application Priority Data
Sep. 22, 2022      (JP) ................................. 2022-150809

(51) Int. Cl.
*G01R 31/52* (2020.01)
*H01M 10/04* (2006.01)
*H01M 10/48* (2006.01)

(52) U.S. Cl.
CPC ............ *G01R 31/52* (2020.01); *H01M 10/04* (2013.01); *H01M 10/48* (2013.01)

(58) Field of Classification Search
CPC ...... G01R 31/52; G01R 31/36; G01R 31/396; H01M 10/04; H01M 10/48; H01M 10/482; Y02E 60/10
See application file for complete search history.

(56) References Cited

U.S. PATENT DOCUMENTS

2015/0212162 A1* 7/2015 Nakayama ........... G01R 31/385
324/426
2018/0097218 A1* 4/2018 Komura .............. H01M 50/414
(Continued)

FOREIGN PATENT DOCUMENTS

JP      2013-084508 A      5/2013
JP      2014-134395 A      7/2014
JP      2018-045874 A      3/2018

*Primary Examiner* — Huy Q Phan
*Assistant Examiner* — Haidong Zhang
(74) *Attorney, Agent, or Firm* — HAUPTMAN HAM, LLP

(57) ABSTRACT
A method for inspecting a battery for short circuit includes: adjusting batteries, which have been subjected to initial charging and subsequent charging and discharging, to a first device voltage; measuring a pre-leaving voltage; leaving the batteries for a leaving period with terminals in an open state; measuring a post-leaving device voltage; actually measuring an actual measured voltage drop rate; determining whether or not each voltage is short-circuited; and, prior to the determining, estimating an estimating voltage drop rate according to an elapsed time and a leaving period. In the determining, it is determined whether or not each battery is short-circuited using the actual voltage drop rate and the estimated voltage drop rate.

4 Claims, 7 Drawing Sheets

(56)                    References Cited

U.S. PATENT DOCUMENTS

2020/0041575 A1*   2/2020  Kobayashi ........... G01R 31/392
2021/0011087 A1*   1/2021  Kobayashi .......... H01M 10/446
2023/0055095 A1*   2/2023  Wang ................. G01R 31/3835

* cited by examiner

METHOD FOR INSPECTING A POWER STORAGE DEVICE FOR SHORT CIRCUIT, METHOD FOR MANUFACTURING THE POWER STORAGE DEVICE, AND METHOD FOR MANUFACTURING A CONNECTED RESTRAINED-DEVICE MODULE

CROSS-REFERENCE TO RELATED APPLICATIONS

This application is based upon and claims the benefit of priority to Japanese Patent Application No. 2022-150809 filed on Sep. 22, 2022, the entire contents of which are incorporated herein by reference.

BACKGROUND

Technical Field

The present disclosure relates to a method for inspecting a power storage device for short circuit, a method for manufacturing the power storage device, and a method for manufacturing a connected restrained-device module.

Related Art

In manufacturing power storage devices such as secondary batteries, a short-circuit test is conventionally performed. For example, Japanese unexamined patent application publication No. 2014-134395 discloses a method for inspecting a secondary battery for short circuit, the method including an SOC adjusting step of adjusting a value of SOC by discharging the secondary battery (also simply referred as a battery) that has been initially charged and a self-discharging step of making self-discharge of the battery having the adjusted SOC, that is, the battery adjusted to a predetermined battery voltage, by leaving the battery to stand, in which it is determined whether or not a short circuit exist in the battery based on a voltage drop amount of the battery in the self-discharging step. This is because a battery with a short circuit decreases with a larger voltage drop amount than a battery without a short circuit during the same period in the self-discharge step.

SUMMARY

Technical Problems

When batteries having been charged for the first time, i.e., initially-charged batteries, are adjusted to a predetermined battery voltage and then left to stand, the battery voltage more largely drops in a short-circuited battery than in a battery having no short circuit, which will be also referred to as a non-short-circuited battery, during the same period, as described above. This is because electric charges stored in the short-circuited battery are discharged through a short-circuit portion of this battery. In this case, assuming that a resistance value of the short-circuit portion does not change, the battery is generally discharged at a constant current, and the battery voltage of the short-circuited battery will generally drop at a constant rate, except the range that the battery voltage changes sharply and nonlinearly with respect to an accumulated charge amount when the SOC of the battery is low, for example, when the SOC is 10% or less.

However, when the initially-charged battery is adjusted to the predetermined battery voltage and then left to stand, a possible battery voltage drop is caused not only due to a short circuit as described above. For example, a (non-defective) battery that is not short-circuited is initially charged and subsequently charged and discharged for testing a capacity. The battery is then charged and adjusted to a predetermined battery voltage, and further left to stand. In this case, the battery voltage will drop at a relatively large rate immediately after being adjusted to the predetermined battery voltage. However, the battery voltage will behave to drop slowly over time and finally approach a generally constant battery voltage value. This is conceivably because SEI coating formation on the surfaces of active material particles by reaction between those particles and an electrolyte slows down with time, and the battery voltage drop caused by such coating formation converges. In other words, for the battery having undergone initial charge and subsequent charge and discharge, the magnitude of a drop amount of battery voltage that occurs during the short-circuit inspection varies depending on the length of an elapsed time from completion of adjustment to the predetermined battery voltage by charging or discharging until start of the short circuit inspection.

In a non-short-circuited battery, the battery voltage will drop as above after completion of adjustment to the predetermined battery voltage. In contrast, in a short-circuited battery, the battery voltage will drop as a combination of the voltage drop occurring in a non-short-circuited battery and the voltage drop caused by a short circuit. For this reason, it is difficult to determine whether or not a short circuit exists in a battery (i.e., a power storage device) based solely on a battery voltage drop rate that occurs during short-circuit inspection.

The present disclosure has been made to address the above problems and has a purpose to provide a method for inspecting a power storage device for short circuit, capable of appropriately determining whether or not a short circuit exists in a power storage device that has been initially charged and adjusted to a predetermined device voltage, a method for manufacturing the power storage device using this inspecting method, and a method for manufacturing a connected restrained-device module using this inspection method.

Means of Solving the Problems (1) To achieve the above-mentioned purpose, one aspect of the present disclosure provides a method for inspecting a power storage device for short circuit, the method comprising: adjusting a voltage of a power storage device, which has been initially charged, to a first device voltage by charging or discharging the power storage device; measuring a pre-leaving device voltage of the power storage device; leaving the power storage device that has been measured for the pre-leaving device voltage, for a leaving period with terminals in an open state; measuring a post-leaving device voltage of the power storage device after the leaving; obtaining an actual measured voltage drop rate of the power storage device between the pre-leaving device voltage and the post-leaving device voltage; and determining whether or not the power storage device is short-circuited by use of the actual measured voltage drop rate of the power storage device, wherein the method further includes: before determining the short circuit, estimating an estimated voltage drop rate to be generated in the power storage device according to an elapsed time from completion of voltage adjustment in adjusting the voltage of a power storage device until start of measurement of the pre-leaving device voltage in measuring the pre-leaving voltage and the leaving period, and in determining the short circuit, it is determined whether or not the power storage device is short-circuited using the actual measured voltage drop rate and the estimated voltage drop rate.

In this short-circuit inspecting method for a power storage device, for each of the power storage devices, the actual measured voltage drop rate is actually measured while the estimated voltage drop rate is obtained according to the elapsed time and the leaving period, and it is determined whether or not the relevant power storage device is short-circuited by use of those voltage drop rates. Thus, the presence/absence of a short circuit in each power storage device can be appropriately determined.

In the estimating process, in obtaining the estimated voltage drop rate according to the elapsed time and the leaving period, the elapsed time and the leaving period which are acquired for the power storage devices in the preceding same lot or the power storage devices with the same product number in different lots may be utilized to obtain the estimated voltage drop rate.

The "power storage device" may include for example a secondary battery such as a lithium-ion secondary battery, a capacitor such as a lithium-ion capacitor, and others.

(2) The method for inspecting a power storage device for short circuit, described in (1), further comprises: after adjusting the voltage of a power storage device but before measuring the pre-leaving voltage, restraining a plurality of the power storage devices each having been adjusted to the first device voltage by a restraining member, while the power storage devices are unconnected to each other, to constitute a restrained-device module including a plurality of restrained devices which are the power storage devices under restraint, and wherein measuring the pre-leaving voltage, leaving, and measuring the post-leaving voltage measuring are performed on the restrained devices included in the restrained-device module.

This short-circuit inspecting method for a power storage device can appropriately determine whether or not the restrained device is short-circuited at the stage of the restrained device which is the power storage device being restrained.

The "restrained-device module" may be any restrained unit in which a plurality of power storage devices are restrained together or individually in a predetermined direction using a restraining member. For example, it may include a device stack such as a battery stack in which a plurality of power storage devices, such as secondary batteries, are stacked in a row in a stacking direction.

In constituting the restrained-device module including the restrained devices by restraining a plurality of power storage devices each adjusted to the first device voltage in the voltage adjusting process, the power storage devices may be restrained promptly after being adjusted to the first device voltage to constitute the restrained-device module. Furthermore, the restrained-device module may be constituted by leaving the power storage devices to stand for an appropriate period in a non-restrained condition or in a more weakly restrained condition than a restrained condition of the restrained-device module, and removing a power storage device(s) determined to be short-circuited in this state.

(3) Another aspect of the present disclosure provides a method for manufacturing a power storage device comprising: inspecting whether or not a power storage device is short-circuited by the method for inspecting a power storage device for short circuit described in (1); and eliminating the power storage device determined to be short-circuited in inspecting the short circuit.

In the above-described manufacturing method for the power storage device, a short-circuited power storage device (s) is eliminated, so that a non-short-circuited power storage device can be appropriately manufactured.

(4) Still another aspect of the present disclosure provides a method for manufacturing a connected restrained-device module comprising: inspecting whether or not each of the restrained devices included in a single restrained-device module is short-circuited by the method for inspecting a power storage device for short circuit described in (2); and connecting the restrained devices included in the restrained-device module to each other when all of the restrained devices included in the restrained-device module are determined not to be short-circuited.

In the above-described manufacturing method for a connected restrained-device module, each restrained device included together in the single restrained-device module is inspected for a short circuit in the short circuit inspecting process. Then, for the restrained-device module determined that all of the included restrained device are not short-circuited, those restrained devices are connected to each other in the connecting process. In this manner, for only the restrained-device module consisting of the restrained devices that are determined not to be short-circuited, these restrained devices are connected to each other to easily manufacture a connected restrained-device module.

The method of connecting the restrained devices (i.e., the power storage devices) may be selected according to the structure of connection terminals of the power storage devices, or the like. For example, this connecting method may be performed using bus bars. Further, the power storage devices may be electrically connected in series or in parallel.

(5) Furthermore, in the method for manufacturing a connected restrained-device module described in (4), the restrained-device module comprises a plurality of restrained-device modules, and the method further comprises: removing at least one restrained device having been determined to be short-circuited in inspecting the short circuit from among the restrained devices included in a same restrained-device module of the restrained-device modules; and re-restraining the remaining restrained devices that are determined not to be short-circuited in determining the short circuit together with a supplementary power storage device that is prepared in advance to reconstitute the restrained-device module, the supplementary power storage device having been included in another restrained-device module of the restrained-device modules and determined not to be short-circuited in inspecting the short-circuit.

In the above manufacturing method for a connected restrained-device module, the power storage device(s) determined to be short-circuited is removed in the removing process, while remaining power storage device(s) not short-circuited and a supplementary power storage device(s) that is included in another one of the plural restrained-device modules and determined not to be short-circuited are combined to reconstitute the restrained-device module in the re-restraining process. Consequently, even if the short-circuited power storage device(s) is included in the restrained devices, the restrained-device module can be easily reconstituted to manufacture the connected restrained-device module.

BRIEF DESCRIPTION OF THE DRAWINGS

FIG. 4 is an explanatory diagram of a battery stack in the second embodiment;

FIG. 5 is an explanatory diagram of an unconnected battery stack in the second embodiment;

DETAILED DESCRIPTION OF THE EXEMPLARY EMBODIMENTS

First Embodiment

Figure 1:
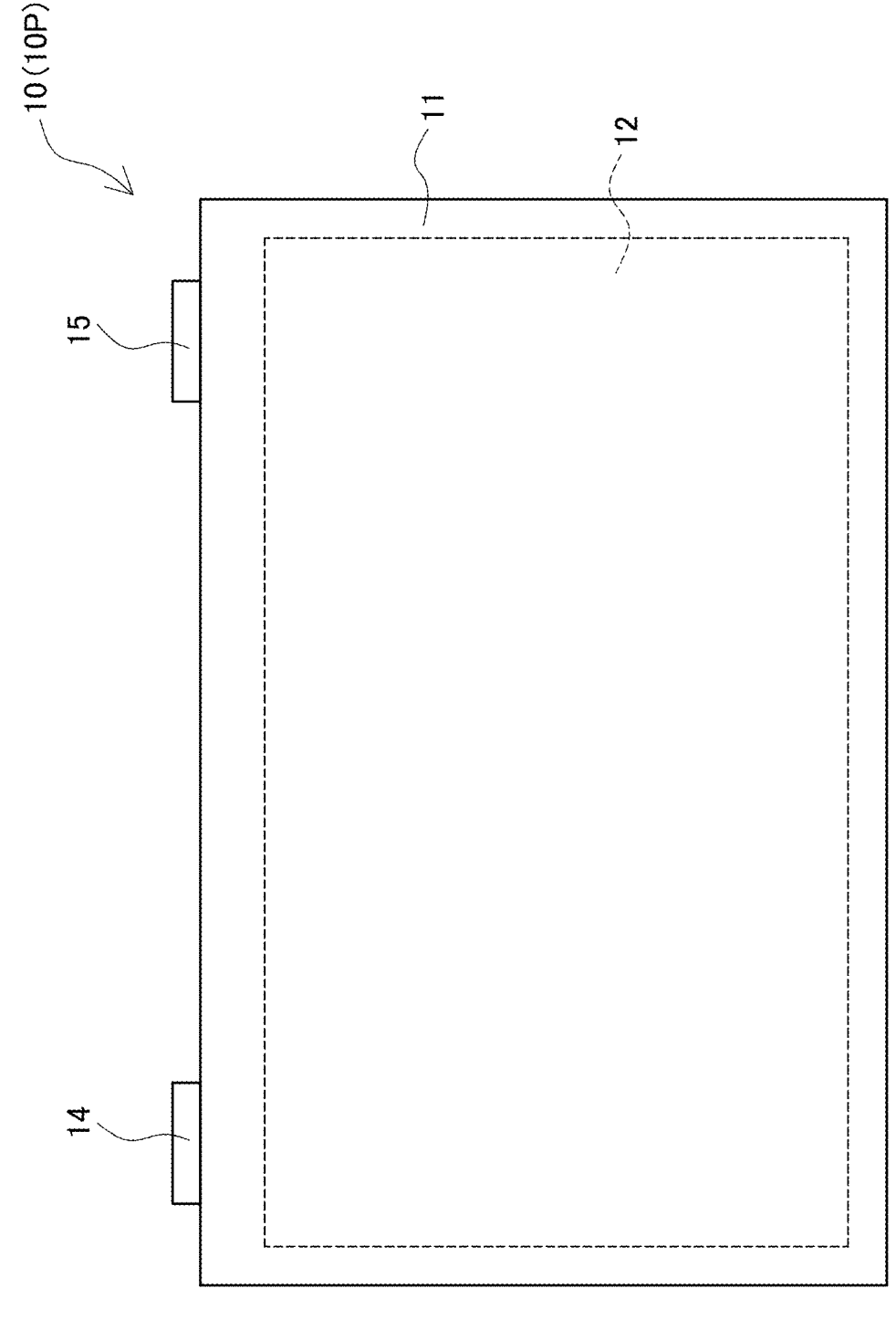
FIG. 1 is an explanatory diagram showing a battery in a first embodiment.

A detailed description of a first embodiment of this disclosure will now be given referring to the accompanying drawings. FIG. 1 is a vertical cross-sectional view of a battery, or a power storage device, 10 in the present embodiment. This battery 10 is a sealed lithium ion secondary battery having a rectangular parallelepiped box shape, which can be mounted in for example vehicles, such as a hybrid car, a plug-in hybrid car, and an electric car, as well as drones and various types of devices.

This battery 10 includes a case 11 made of aluminum in a rectangular parallelepiped box shape, an electrode body 12 accommodated in the case 11, a positive terminal 14 and a negative terminal 15 that are each connected to the electrode body 12 inside the case 11 and protrude out of the case 11, i.e., upward in FIG. 1.

Figure 2:
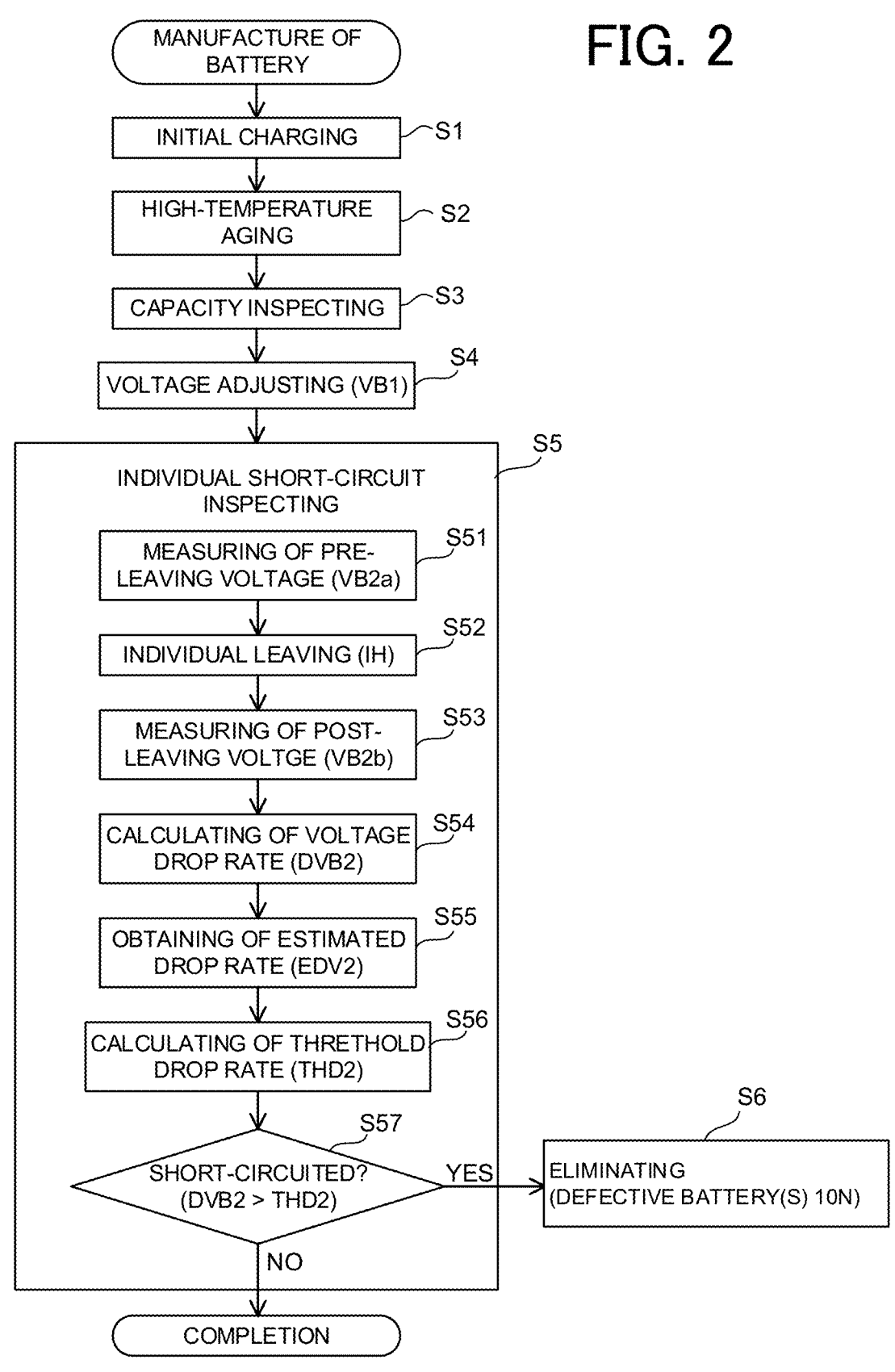
FIG. 2 is a flowchart showing a manufacturing process for the battery in the first embodiment and a second embodiment.

The manufacture of the battery 10 will be described below, referring to FIGS. 2 and 3. Batteries 10 which have not been charged yet (i.e., uncharged batteries 10) are manufactured first. This manufacturing method for sealed batteries 10 each including the rectangular parallelepiped case 11 is well known and thus the details thereof are omitted herein. In an initial charging step S1 (see FIG. 2), the uncharged batteries 10 are initially charged up to 60% to 100% SOC by CCCV charging under a room temperature. In the present embodiment, for example, the CCCV charging is performed with a constant current of 7 C, a cut voltage of 3.75 V (equivalent to 60% SOC), and a cut current of 0.3 C under an ambient temperature of 25° C. In a high-temperature aging step S2, a high-temperature aging treatment is performed by leaving each initially charged battery 10 to stand in an open state for 10 to 200 hours under an ambient temperature of 50° C. to 80° C.; for example, for 18 hours at 70° C. in the present embodiment. After these batteries 10 are cooled, a capacity inspecting step S3 is performed by charging the batteries 10 to 100% SOC and further discharging the batteries 10 to 0% SOC, and measuring the capacity of each battery 10, concretely, the discharged capacity of each battery 10 in the above case.

In a voltage adjusting step S4, subsequently, the batteries 10 are charged under a room temperature until the battery voltage VB of each battery 10 becomes a first voltage VB1 falling within a range of 30% to 100% SOC. In the present embodiment, for example, as in the initial charging step S1, the CCCV charging is performed under an ambient temperature of 25° C., with a constant current of 7 C, a cut voltage of 3.75 V (equivalent to 60% SOC), and a cut current of 0.3 C. Specifically, the battery voltage VB of each battery 10 is once equalized to the same first voltage VB1 (VB1=3.75 V in the present embodiment).

In an individual short-circuit inspecting step S5, subsequently, the batteries 10 having undergone the voltage adjusting step S4 are inspected for short circuit in an individual state, i.e., without restraint. Specifically, a pre-leaving voltage measuring step S51 is performed first to measure a pre-leaving second voltage VB2a, which is the battery voltage VB of each battery 10 before leaving. The battery voltage VB of each battery 10 is once equalized to the same first voltage VB1 by the CCCV charging as described above. However, immediately after the CCCV charging is terminated, the battery voltage VB decreases by that amount of voltage drop occurring in a battery resistance by a charged current during CV charging. In addition, even when the battery(s) 10 is not short-circuited, the battery voltage VB gradually decreases over time as described later (see FIG. 3). Therefore, the pre-leaving second voltage VB2a of each battery 10 after charged to the first voltage VB1 is measured prior to an individual leaving step S52 described below.

As described above, when the battery voltage VB of each battery 10 is adjusted to the first voltage VB1 by the CCCV charging in the voltage adjusting step S4 (this timing is hereinafter assumed as an adjustment completion time Tc), if the battery(s) 10 is not short-circuited since the adjustment completion time Tc, for example, the battery voltage VB of the battery 10 decreases as an elapsed time KT increases as shown in the graph in FIG. 3. In other words, when the CCCV charging is terminated, the battery voltage VB quickly drops just before the end of CV charging by that amount of voltage drop that has been generated by the battery resistance due to supply of a cutoff current (e.g., 1 C) to the battery 10. Furthermore, the battery voltage VB drops significantly (e.g., about 0.003 V=3 mV in FIG. 3) from immediately after the adjustment completion time Tc until about several hours to one day elapses, and then it further decreases gradually. However, the battery voltage VB decreases gradually and slowly, and stabilizes over several hundred days. In other words, the battery voltage VB continues to drop even after a lapse of several days from the adjustment completion time Tc at which the battery voltage VB is adjusted to the first voltage VB1. However, as the elapsed time KT increases, the battery voltage VB decreases slowly, not linearly, as plotted in a downward curve in FIG. 3.

In contrast, if the battery 10 is short-circuited, electric charges stored in the battery 10 are discharged through a short-circuit portion (not shown) in the battery 10. In this case, assuming that a resistance value of the short-circuit portion does not change, the battery 10 is generally discharged at a constant current, and the battery voltage of this battery 10 will generally drop at a constant rate. In other words, if the battery 10 is short-circuited, the battery voltage will change by combination of the drop of battery voltage VB of the battery 10 when it is not short-circuited (see FIG. 3) and the drop of battery voltage VB at a constant percentage caused by constant current discharge in the short circuit portion.

In the following individual leaving step S52, the batteries 10 with the positive terminals 14 and the negative terminals 15 in an open state are left in an unrestrained (i.e., individual) condition or a slightly restrained condition for a leaving period which will be referred to as an individual leaving period IH (IH≥5.0 days (i.e., IH≥120 hours) in the first embodiment), at an ambient temperature of 25° C.

Then, in a post-leaving voltage measuring step S53, a post-leaving second voltage VB2$b$, which is the battery voltage VB of each battery 10 after leaving, is measured.

In the following drop rate obtaining step S54, a second voltage drop rate DVB2, which is a second voltage drop amount per unit time (e.g., per day or per hour), is calculated by dividing a difference voltage (a second voltage drop amount ΔVB2) between the pre-leaving second voltage VB2$a$ and a post-leaving second voltage VB2$b$ by an actual individual leaving period IH.

The length of the individual leaving period IH may vary because the timing at which the post-leaving voltage measuring step S53 can be performed differs between lots in the individual leaving step S52 according to whether or not the individual leaving period IH includes a weekend, whether or not the post-leaving voltage measuring step S53 is delayed, and other factors. Accordingly, in a short-circuit determining step S57 described below, it is easier to compare a drop rate such as the voltage drop rate DVB2 with a determination criteria than to compare the difference voltage (the second voltage drop amount ΔVB2) between the pre-leaving second voltage VB2$a$ and the post-leaving second voltage VB2$b$ with the determination criteria.

Figure 3:
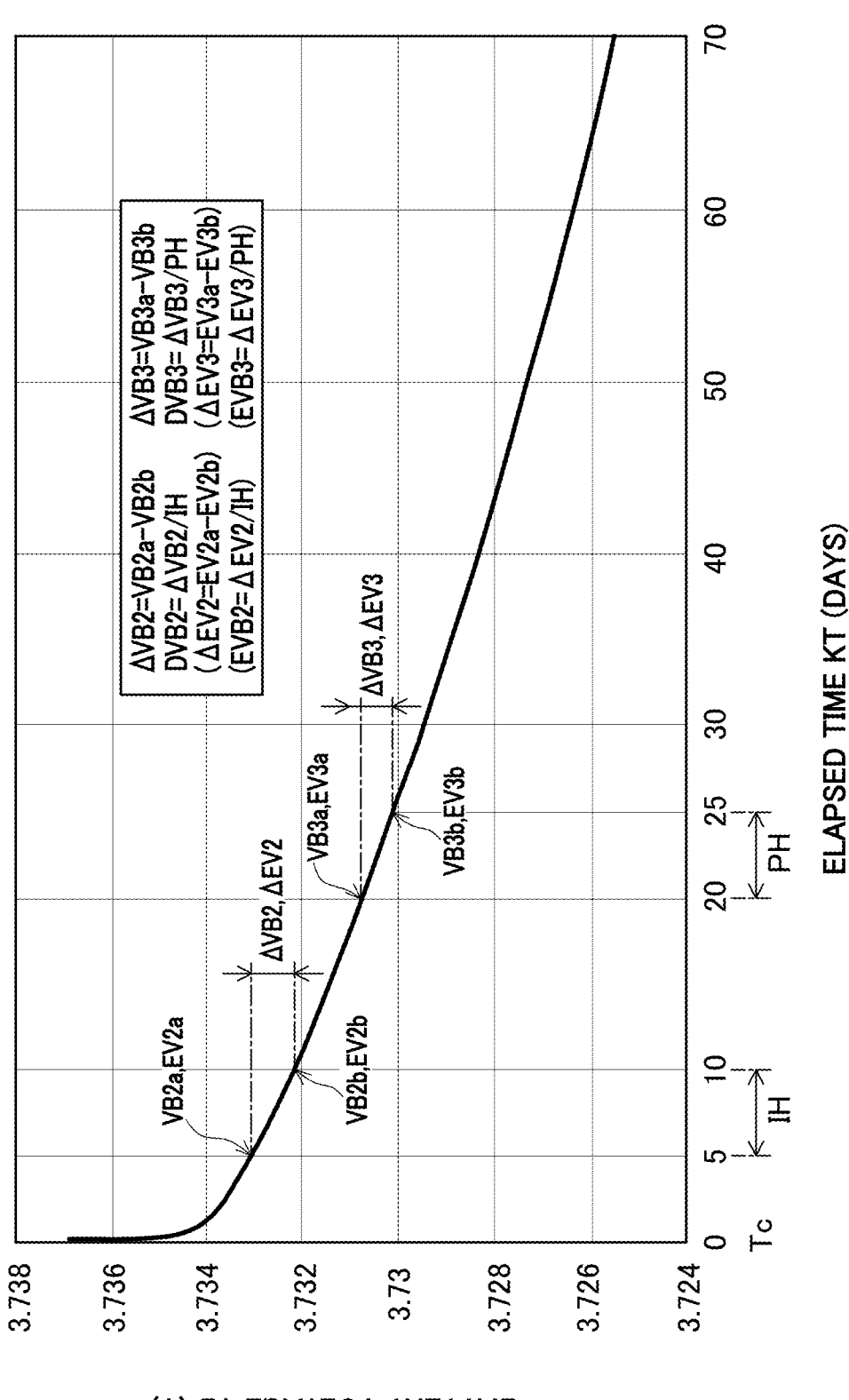
FIG. 3 is a graph showing an example of variations in battery voltage of a battery that is not short-circuited after a voltage adjusting step in the first and second embodiments.

FIG. 3 shows an example of obtaining the pre-leaving second voltage VB2$a$, the post-leaving second voltage VB2$b$, the second voltage drop amount ΔVB2, and the second voltage drop rate DVB2 when an elapsed time KT is 5.0 days and an individual leaving period IH is 5.0 days.

Further, an estimated drop rate obtaining step S55 is performed to estimate an estimated voltage drop rate EDV2 which will be generated in a battery 10. Specifically, there are obtained in advance a relational expression which is obtained based on the following factors (i) to (iii) acquired in advance from the batteries 10 in a preceding same lot or with the same product number in different lots: (i) typical examples of changes in battery voltage VB of batteries 10 since the adjustment completion time Tc in the voltage adjusting step S4 (see FIG. 3); (ii) an elapsed time KT from the adjustment completion time Tc in the voltage adjusting step S4 until the start of measurement of the pre-leaving second voltage VB2$a$ in the pre-leaving voltage measuring step S51; and (iii) the second voltage drop rate DVB2 actually measured according to the individual leaving period IH, and others, and a graph or a relational table showing the relational expression. Using them, for each battery 10 tested this time, the estimated voltage drop rate EDV2 is obtained according to the elapsed time KT from the adjustment completion time Tc and the individual leaving period IH.

For instance, when one typical example of the changes in battery voltage VB is obtained in advance as a graph shown in FIG. 3, the estimated voltage drop rate EDV2 according to the elapsed time KT and the individual leaving period IH can be obtained using this graph of FIG. 3, as with the aforementioned second voltage drop rate DVB2. FIG. 3 also shows another example of obtaining the estimated voltage drop rate EDV2 when the elapsed time KT is 5.0 days and the individual leaving period IH is 5.0 days. Specifically, the following voltage values are obtained: an estimated pre-leaving second voltage EV2$a$ at the time when the elapsed time KT (KT=5.0 days in FIG. 3) from the adjustment completion time Tc to the start of measurement of the pre-leaving second voltage VB2$a$ elapses and an estimated post-leaving second voltage EV2$b$ at the time when the individual leaving period IH further elapses (KT+IH=10.0 days in FIG. 3). Based on those voltage values, an estimated second voltage drop rate ΔEV2 is calculated (=EV2$a$−

EV2$b$), and this result is divided by the individual leaving period IH to obtain an estimated voltage drop rate EDV2 (=ΔEV2/IH).

In the first embodiment, as can be easily understood, for each battery 10, it is possible to obtain the estimated voltage drop rate EDV2 according to the elapsed time KT and the individual leaving period IH even when the elapsed time KT until start of the individual short-circuit inspecting step S5 (i.e., the pre-leaving voltage measuring step S51) differs between the batteries 10 or the length of the individual leaving period IH differs between the batteries 10, after the adjustment completion time Tc.

Furthermore, a threshold drop rate calculating step S56 is performed to calculate a threshold drop rate THD2 by adding a predetermined allowable range PW2 to the obtained estimated voltage drop rate EDV2 (THD2=EDV2+ PW2). This allowable range PW2 is set in advance in consideration of possible fluctuations or others in the estimated voltage drop rate EDV2.

In the short-circuit determining step S57, it is determined whether or not each of the batteries 10 is short-circuited based on the second voltage drop rate DVB2 obtained for each battery 10. Specifically, it is determined whether or not the second voltage drop rate DVB2 is larger than the threshold drop rate THD2, i.e., whether or not DVB2>THD2. If NO in S57, that is, if the second voltage drop rate DVB2 is smaller than the threshold drop rate THD2 (DVB2<THD2), the battery 10 is determined not to be short-circuited. Thus, the individual short-circuit inspecting step S5 is terminated, completing the battery 10.

If YES in S57, that is, if the second voltage drop rate DVB2 is larger than the threshold drop rate THD2 (DVB2>THD2), the battery 10 is determined to be short-circuited, and the process shifts to the battery eliminating step S6. In this step S6, a defective battery 10N, which is determined to be short-circuited, is eliminated from the manufacturing process.

In the short-circuit inspecting method and the manufacturing method for the batteries 10 in the first embodiment, the second voltage drop rate DVB2 is actually measured on each of the batteries 10, while the estimated voltage drop rate EDV2 according to the elapsed time KT and the individual leaving period IH is obtained. Based on these two values, it is determined whether or not the relevant battery 10 is short-circuited, so that the presence/absence of a short circuit in a battery 10 can be appropriately determined. Since the short-circuited battery 10 is eliminated from the manufacturing process, a battery 10 with no short circuit can be appropriately manufactured.

Second Embodiment

Figure 4:
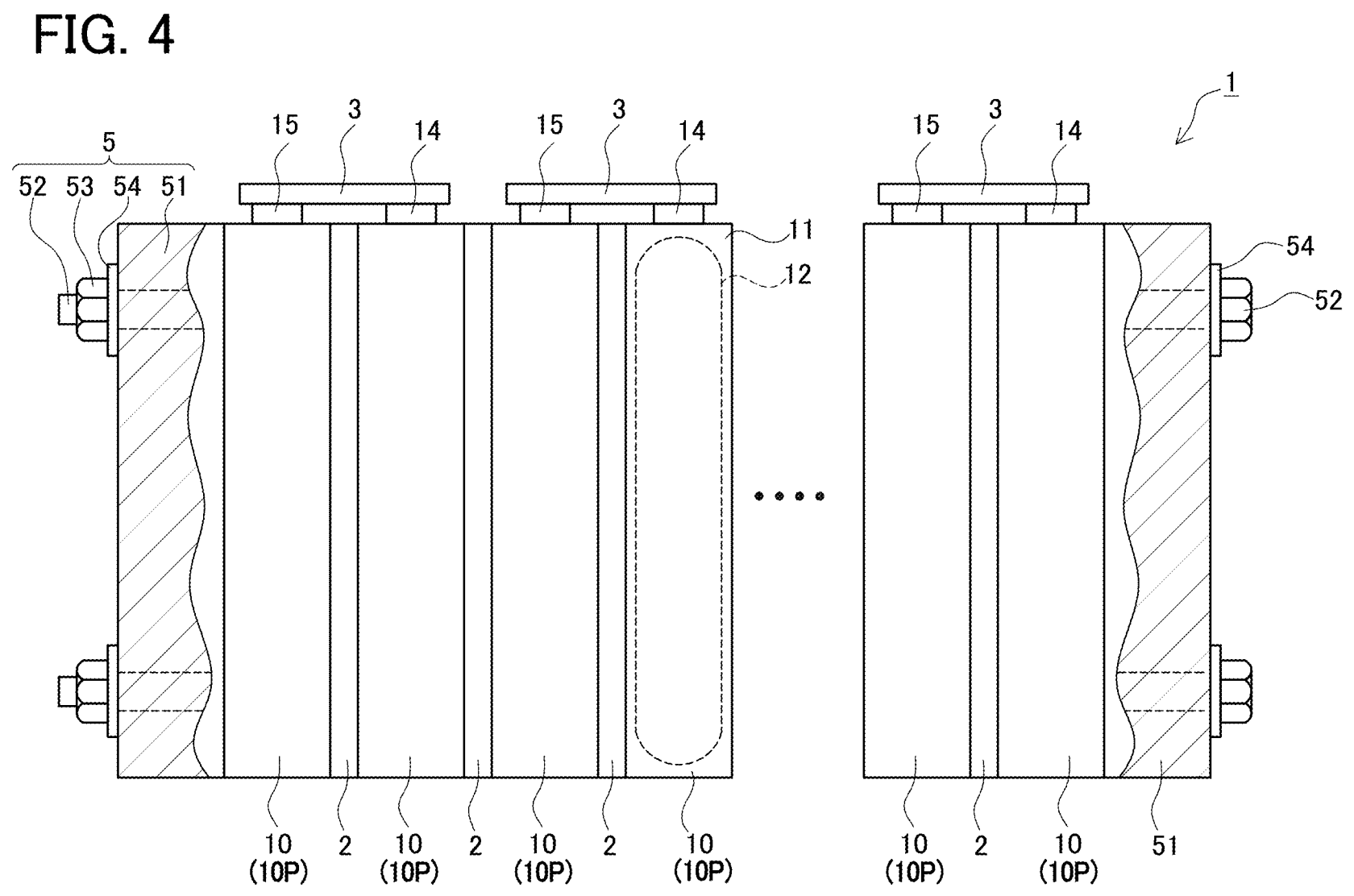

A battery stack 1 in a second embodiment will be described below referring to the accompanied drawings. FIG. 4 shows a battery stack 1 in the second embodiment in which a plurality of (e.g., twenty-eight) batteries 10 (see FIG. 1) each having a rectangular parallelepiped box shape are stacked and restrained into a fixed dimension by restraining members 5. The battery stack 1 is one example of a connected restrained-device module and the battery 10 is one example of a power storage device in the present disclosure. In this battery stack 1, the batteries 10 are stacked in the stacking direction SH, i.e., the horizontal direction in FIG. 1, with spacers 2 interposed therebetween, and the batteries 10 are restrained under pressure by the restraining members 5 in the stacking direction SH. Specifically, a plurality of restrained batteries 10P (i.e., the batteries 10)

and the spacers 2 are alternately stacked and held between a pair of restraining plates 51. These restrained batteries 10P are further pressed and restrained in the stacking direction SH by use of restraining bolts 52 extending in the stacking direction SH and bridging between the restraining plates 51, and nuts 53 screwed on the bolts 52 through washers 54. A positive terminal 14 and a negative terminal 15 of each restrained battery 10P are connected to those of adjacent restrained batteries 10P through bus bars 13. In the battery stack 1 in the second embodiment, as shown in FIG. 4, the restrained batteries 10P are arranged to be alternately reversed so that the positive terminals 14 and the negative terminals 15 are alternately aligned in a row in the stacking direction SH. By linking through the bus bars 3, the restrained batteries 10P are connected in series. The battery stack 1 is used for example in vehicles, such as a hybrid car, a plug-in hybrid car, and an electric car.

Figure 5:
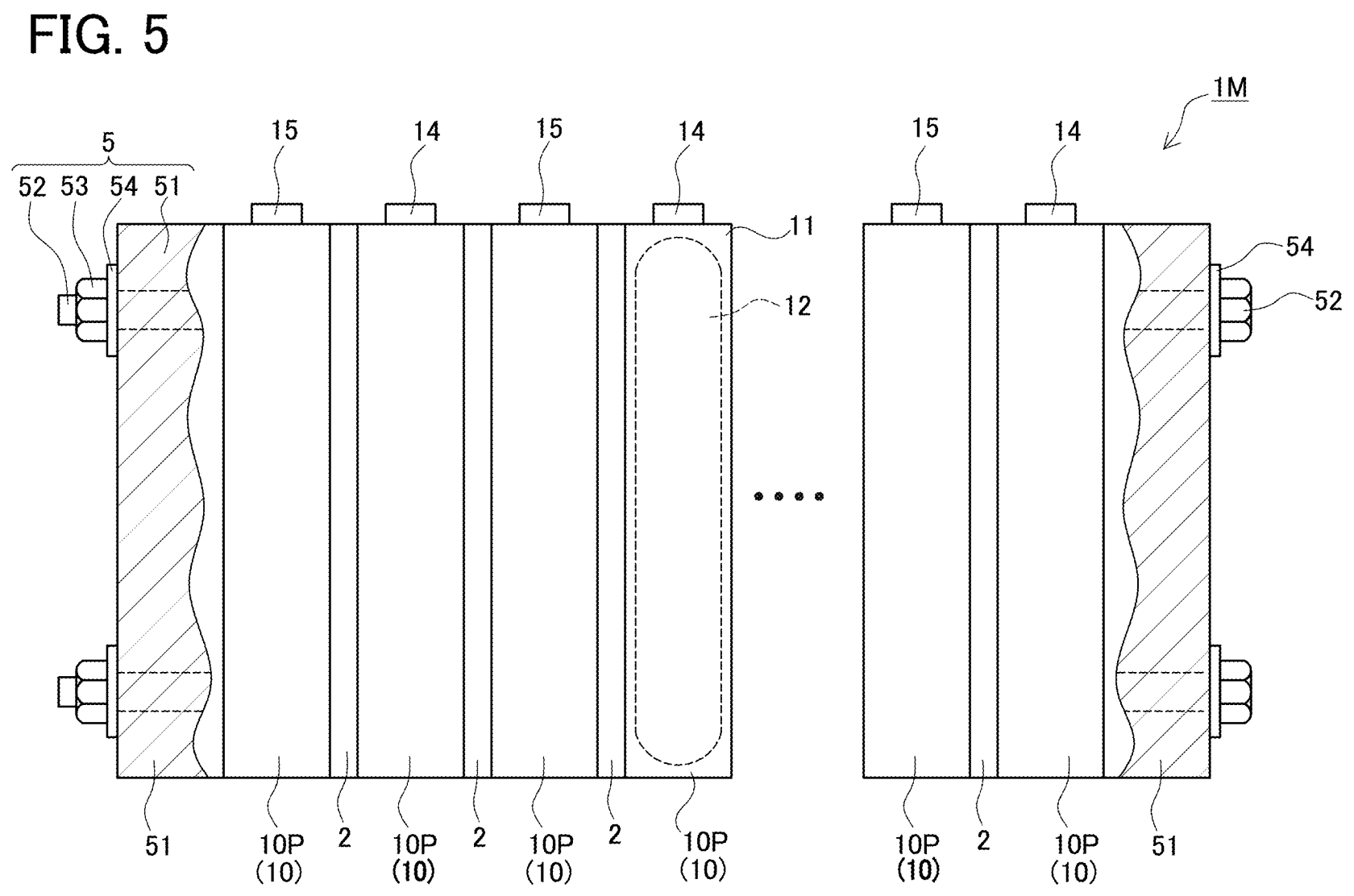

Next, the manufacture of the battery stack 1 will be described below, referring to FIGS. 5 to 7. The uncharged batteries 10 are manufactured first. In the initial charging step S1 (see FIG. 6), the uncharged batteries 10 are initially charged by CCCV charging as in the first embodiment. The high-temperature aging step S2 is then performed for a high-temperature aging treatment on each battery 10. After the batteries 10 are cooled, the batteries 10 are charged and discharged in the capacity inspecting step S3 to measure the capacity of each battery 10. In the voltage adjusting step S4, as in the first embodiment, each battery 10 is charged until the battery voltage VB of each battery 10 is once equalized to the same first voltage VB1, concretely, VB1=3.75 V. Furthermore, the individual short-circuit inspecting step S5 is performed and thus a defective battery 10N is eliminated in the manufacturing process in the voltage eliminating step S6, as in the first embodiment. Thus, non-short-circuited batteries 10 are manufactured.

Accordingly, through the steps up to this stage, it is possible to determine whether or not each battery 10 is short-circuited, as in the first embodiment. The short-circuited battery(s) 10 is then eliminated from the manufacturing process, so that each battery 10 that is not short-circuited can be properly manufactured and supplied to subsequent processes.

In the following restraining step S27 (see FIG. 6), the batteries 10 determined not to be short-circuited in the individual short-circuit inspecting step S5 (concretely, the individual short-circuit determining step S57) and the spacers 2 are assembled together by use of the restraining members 5 to constitute a stack of unconnected batteries, which will be referred to as an unconnected battery stack 1M (see FIG. 5), by a well-known method. In this unconnected battery stack 1M, the batteries 10 are referred to as the restrained batteries 10P that are pressed and restrained in the stacking direction SH, i.e., a horizontal direction in FIG. 5. Therefore, in the electrode body 12 of each restrained battery 10P, positive and negative electrode sheets or plates not shown, which are stacked or laminated with separators interposed therebetween, are compressed in the thickness direction corresponding to the stacking direction SH. However, unlike the battery stack 1 (see FIG. 4), no bus bar 3 is attached and thus the positive terminals 14 and the negative terminals 15 are not connected between the adjacent restrained batteries 10P, so that each restrained battery 10P is in an open state. For this unconnected battery stack 1M, the restrained batteries 10P under restraint are individually subjected to short-circuit inspection. From this restraining step S27, a plurality of (e.g., twenty-eight in the present embodiment) restrained batteries 10P included in a single, i.e., the same, unconnected battery stack 1M (or the battery stack 1) are treated as one group.

In the second embodiment, following the restraining step S27, a restraint short-circuit inspecting step S28 (see FIG. 7) is performed for short-circuit inspection on each restrained battery 10P under restraint, i.e., under compression, in the unconnected battery stack 1M to detect whether or not each restrained battery 10P is short-circuited.

In the restraint short-circuit inspecting step S28, a pre-leaving voltage measuring step S281 is performed to measure a pre-leaving third voltage VB3$a$, which is the battery voltage VB of each restrained battery 10P included in a group of restrained batteries 10P forming the single unconnected battery stack 1M. Even when a restrained battery(s) 10P is not short-circuited, as described above, the battery voltage VB thereof decreases over time (see FIG. 3). Therefore, the pre-leaving third voltage VB3$a$ of each restrained battery 10P is measured prior to the restraint leaving step S282 described below.

In the following restraint leaving step S282, the unconnected battery stack 1M, that is, the group of restrained batteries 10P restrained by the restraining members 5, with the positive terminals 14 and the negative terminals 15 in an open state, is left standstill under restraint for a leaving period PH which will be referred to as a restraint leaving period PH (PH≥5.0 days (i.e., PH≥120 hours)) in the present embodiment, at an ambient temperature of 25° C. Then, in a post-leaving voltage measuring step S283, a post-leaving third voltage VB3$b$, which is the battery voltage VB of each of the restrained batteries 10P belonging to the single unconnected battery stack 1M after leaving, is measured.

In the following voltage drop rate obtaining step S284, for a group of the restrained batteries 10P forming the single unconnected battery stack 1M, a third voltage drop amount ΔVB3, which is a difference voltage between the pre-leaving third voltage VB3$a$ and the post-leaving third voltage VB3$b$ in each restrained battery 10P, is calculated (ΔVB3=VB3$a$−VB3$b$).

Furthermore, the third voltage drop amount ΔVB3 of each of the restrained batteries 10P is divided by an actual restraint leaving period PH to calculate a third voltage drop rate DVB3, which is a third voltage drop amount per unit time, e.g., per day or per hour. The length of the restraint leaving period PH may slightly differ between the unconnected battery stacks 1M depending on whether or not the restraint leaving period PH includes a weekend, whether or not the post-leaving voltage measuring step S283 is delayed, and other factors. Therefore, in a restraint short-circuit determining step S287 and others mentioned below, it is easier to perform the following determination using the third voltage drop rate DVB3 than using the third voltage drop amount ΔVB3 itself.

FIG. 3 shows an example of obtaining the pre-leaving third voltage VB3$a$, the post-leaving third voltage VB3$b$, the third voltage drop amount ΔVB3, and the third voltage drop rate DVB3 when the elapsed time KT is 20.0 days and the restraint leaving period PH is 5.0 days.

Further, an estimated drop rate obtaining step S285 is performed to estimate an estimated voltage drop rate EDV3 which will be generated in each restrained battery 10P. Specifically, there are obtained in advance a relational expression which is obtained based on the following factors acquired in advance from the batteries 10 in a preceding same lot or with the same product number in different lots: (i) typical examples of changes in battery voltage VB of batteries 10 since the adjustment completion time Tc in the voltage adjusting step S4 (see FIG. 3); (ii) an elapsed time KT from the adjustment completion time Tc in the voltage adjusting step S4 until the start of measurement of the pre-leaving third voltage VB3$a$ in the pre-leaving voltage measuring step S281; and (iii) the third voltage drop rate DVB3 actually measured according to the restraint leaving period PH, and others, and a graph or a relational table showing the relational expression. Using them, for each restrained battery 10 tested this time, the estimated voltage drop rate EDV3 is obtained according to the elapsed time KT from the adjustment completion time Tc and the restraint leaving period PH.

For instance, when one typical example of the changes in battery voltage VB is obtained in advance as a graph shown in FIG. 3, the estimated voltage drop rate EDV3 according to the elapsed time KT and the restraint leaving period PH can be obtained using this graph of FIG. 3, as with the aforementioned third voltage drop rate DVB3. FIG. 3 also shows another example of obtaining the estimated voltage drop rate EDV3 when the elapsed time KT is 20.0 days and the restraint leaving period PH is 5.0 days. Specifically, the following voltage values are obtained: an estimated pre-leaving third voltage EV3$a$ at the time when the elapsed time KT (KT=20.0 days in FIG. 3) from the adjustment completion time Tc to the start of measurement of the pre-leaving third voltage VB3$a$ elapses and an estimated post-leaving third voltage EV3$b$ at the time when the restraint leaving period PH further elapses (KT+PH=25.0 days in FIG. 3). Based on those voltage values, an estimated third voltage drop rate ΔEV3 is calculated (=EV3$a$−EV3$b$), and this result is divided by the restraint leaving period PH to obtain an estimated voltage drop rate EDV3 (=ΔEV3/IH).

In the second embodiment, as can be easily understood, for each of the restrained batteries 10 in a group belonging to a single unconnected battery stack 1M, it is possible to obtain the estimated voltage drop rate EDV3 according to the elapsed time KT and the restraint leaving period PH even when the elapsed time KT until start of the restraint short-circuit inspecting step S28 (i.e., the pre-leaving voltage measuring step S281) differs between the restrained batteries 10P or the length of the restraint leaving period PH differs between the unconnected battery stacks 1M, after the adjustment completion time Tc.

Furthermore, a threshold drop rate calculating step S286 is performed to calculate a threshold drop rate THD3 by adding a predetermined allowable range PW3 to the obtained estimated voltage drop rate EDV3 (THD3=EDV3+PW3). This allowable range PW3 is set in advance in consideration of possible variations or others in the estimated voltage drop rate EDV3.

In a restraint short-circuit determining step S287, it is determined whether or not each of the restrained batteries 10P in a group belonging to the single unconnected battery stack 1M is short-circuited based on the third voltage drop rate DVB3 obtained for each restrained battery 10P. Specifically, if the third voltage drop rate DVB3 is smaller than the threshold drop rate THD3 (DVB3<THD3), the tested restrained battery 10 is determined not to be short-circuited. In contrast, if the third voltage drop rate DVB3 is larger than the threshold drop rate THD3 (DVB3>THD3), the tested restrained battery 10P is determined to be short-circuited, that is, it is considered to be a defective battery 10N.

In this restraint short-circuit determining step S287, it is further determined whether or not a group of the restrained batteries 10P belonging to the single unconnected battery stack 1M includes a defective battery(s) 10N. If YES in S287, that is, if the unconnected battery stack 1M includes a defective battery(s) 10N, this unconnected battery stack 1M is shifted to a removing step S2A which will be described later. In contrast, if NO in S287, that is, if the unconnected battery stack 1M includes no defective battery 10N, this unconnected battery stack 1M is shifted to a connecting step S29.

In the following connecting step S29, the positive terminals 14 and the negative terminals 15 of a group of the restrained batteries 10P forming the unconnected battery stack 1M are connected with the bus bars 3 to interconnect the restrained batteries 10P, thus completing the battery stack 1 (see FIG. 4).

Accordingly, the aforementioned short-circuit inspecting method for the batteries 10 can appropriately determine whether or not each of the restrained batteries 10P, which are the batteries 10 under restraint. In this manner, for only the unconnected battery stack 1M constituted of the restrained batteries 10P which are all determined not to be short-circuited, those restrained batteries 10P are connected to each other to easily manufacture a connected battery stack 1.

On the other hand, in a removing step S2A, the defective battery(s) 10N is removed from the unconnected battery stack 1M including at least one defective battery 10N. Specifically, the restraining bolts 52 and the nuts 53 of the restraining members 5 are unfastened, and the defective battery(s) 10N is removed from the unconnected battery stack 1M and eliminated from the manufacturing process.

In the following re-restraining step S2B, the unconnected battery stack 1M from which the defective battery(s) 10N has been removed is supplied with as many supplementary batteries 10H as the removed battery(s) 10N. Then, a group of the unremoved restrained battery(s) 10P and the supplementary battery(s) 10H is restrained again using the restraining members 5 to reconstitute the unconnected battery stack 1M (see FIG. 6). The supplementary battery 10H is a battery 10 that has been prepared in advance for supplemental use, which was included in another unconnected battery stack 1M (i.e., a different one of the plural unconnected battery stacks 1M) and already determined not to be short-circuited in the restraint short-circuit inspecting step S28. Then, this reconstituted unconnected battery stack 1M is subjected again to the restraint short-circuit inspecting step S28 and repeatedly reconstituted by supplementing a supplementary battery(s) 10H until no defective battery 10N is generated. In the restraint short-circuit determining step S287, if no defective battery 10N is included in the reconstituted unconnected battery stack 1M, this battery stack 1M is shifted to the connecting step S29 as described above.

In the connecting step S29, the bus bars 3 are connected to the positive terminals 14 and the negative terminals 15 of the group of the restrained batteries 10P forming the reconstituted unconnected battery stack 1M to interconnect the restrained batteries 10P, completing the battery stack 1 (see FIG. 4). Thus, even when the short-circuited battery(s) 10 is included in the unconnected battery stack 1M, it is possible to easily reconstitute the unconnected battery stack 1M to manufacture the battery stack 1.

Figure 6:
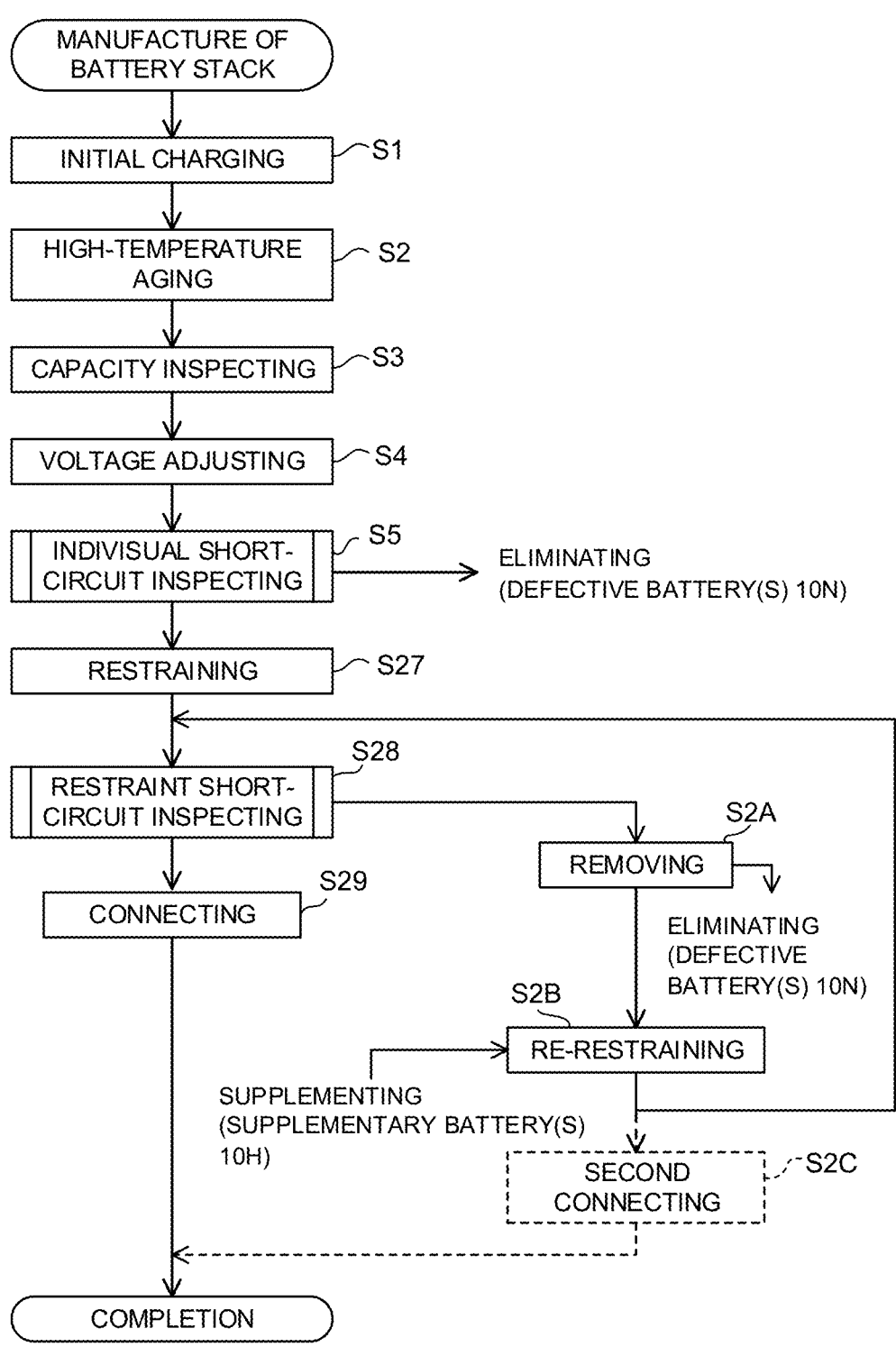
FIG. 6 is a flowchart showing a manufacturing process for the battery stack in the second embodiment.
Figure 7:
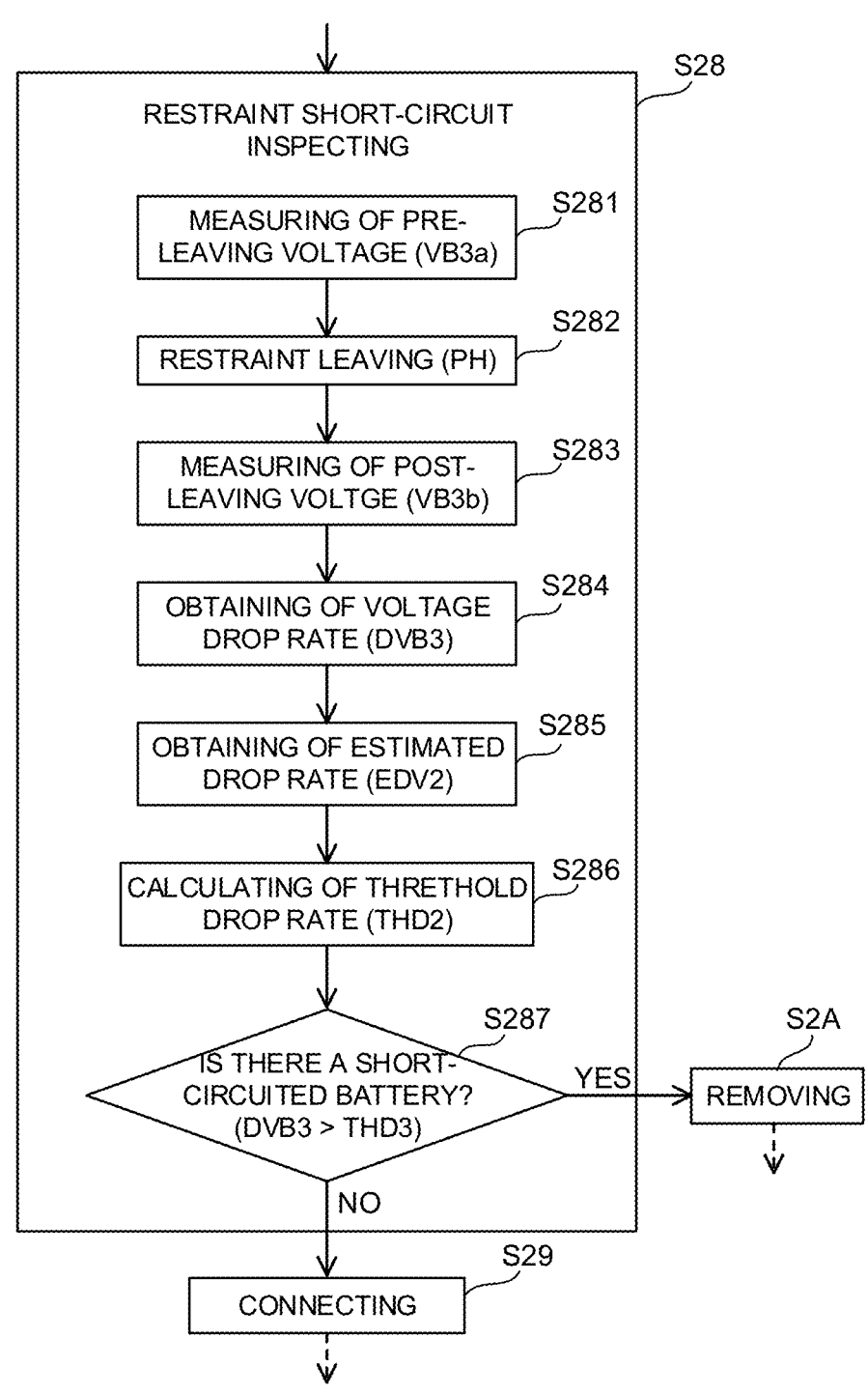
FIG. 7 is a flowchart showing the details of a restraint short-circuit inspecting step of the manufacturing process for the battery stack in the second embodiment.

If there is a low probability that any more defective battery(s) 10N is generated in the unconnected battery stack 1M reconstituted by re-restraining the restrained batteries 10P in the re-restraining step S2B, a second connecting step S2C may be performed following the re-restraining step S2B, as indicated by a broken line in FIG. 6, by connecting the bus bars 3 to the positive terminals 14 and the negative terminals 15 of the group of the restrained batteries 10P of the reconstituted unconnected battery stack 1M to interconnect the restrained batteries 10P, completing the battery stack 1 (see FIG. 4). This can more easily reconstitute the unconnected battery stack 1M to manufacture the battery stack 1.

The present disclosure is described in the first and second embodiments, but is not limited thereto. The present disclosure may be embodied in other specific forms without departing from the essential characteristics thereof. For instance, the battery stack 1 in the second embodiment is constituted of the restrained batteries 10P that are electrically connected in series to each other through the bus bars 3. As an alternative, a restrained-device module may be constituted of the restrained batteries 10P that are electrically connected in parallel to each other.

In the first and second embodiments, in the manufacturing process for the batteries 10, the capacity inspecting step S3 is performed by charging each battery 10 to 100% SOC and then discharging each battery 10 to 0% SOC, and measuring the capacity of each battery 10, and then the voltage adjusting step S4 is performed by charging each battery 10 until the battery voltage VB becomes the first voltage VB1. However, contrary to the above embodiments, the capacity inspecting step may be performed by discharging each battery 10 to 0% SOC and charging each battery 10 to 100% SOC, and measuring the charge capacity of each battery 10, and then the voltage adjusting step S4 may be performed by discharging each battery 10 until the battery voltage VB becomes the first voltage VB1.

REFERENCE SIGNS LIST

1 Battery stack (Connected restrained-device module)
1M Unconnected battery stack (Restrained-device module)
SH Stacking direction
5 Restraining member
10 Battery (Secondary battery, Power storage device)
10N Defective battery
10H Supplementary battery
10P Restrained battery (Restrained device)
VB Battery voltage
VB1 First voltage (First device voltage)
VB2$a$ Pre-leaving second voltage (Pre-leaving device voltage)
VB2$b$ Post-leaving second voltage (Post-leaving device voltage)
DVB2 Second voltage drop rate (Actual measured voltage drop rate)
EDV2, EDV3 Estimated drop rate
PW2, PW3 Allowable range
THD2, THD3 Threshold drop rate
VB3$a$ Pre-leaving third voltage (Pre-leaving device voltage)
VB3$b$ Post-leaving third voltage (Post-leaving device voltage)
ΔVB3 Third voltage drop amount
DVB3 Third voltage drop rate (Actual measured voltage drop rate)
EV3$a$ Estimated pre-leaving third voltage
EV3$b$ Estimated post-leaving third voltage
ΔEB3 Estimated third voltage drop amount
Tc Adjustment completion time
KT Elapsed time
S1 Initial charging step
S4 Voltage adjusting step
S5 Individual short-circuit inspecting step (Short-circuit inspecting step)
S51, S281 Pre-leaving voltage measuring step S52 Individual leaving step (Leaving step)
IH Individual leaving period
S53, S283 Post-leaving voltage measuring step
S54, S284 Voltage drop amount calculating step (Actually measuring step)
S55, S285 Estimated drop rate calculating step (Estimating step)
S56, S286 Threshold drop rate calculating step
S57 Individual short-circuit determining step (Short-circuit determining step)
S6 Battery eliminating step (Eliminating step)
S27 Restraining step
S28 Restraint short-circuit determining step (Short-circuit inspecting step)
S282 Restraint leaving step (Leaving step)
PH Restraint leaving period
S287 Restraint short-circuit determining step (Short-circuit determining step)
S29 Connecting step
S2A Removing step
S2B Re-restraining step
S2C Second connecting step

What is claimed is:

1. A power storage device inspecting method, comprising:
a voltage adjusting step of adjusting a voltage of a power storage device, which has been initially charged, to a first device voltage by charging or discharging the power storage device;
a pre-leaving voltage measuring step of measuring a pre-leaving device voltage of the power storage device, wherein the pre-leaving device voltage is a voltage of the power storage device before the power storage device is left standstill;
a leaving step of leaving the power storage device, that has been measured for the pre-leaving device voltage, standstill for a leaving period with terminals of the power storage device in an open state;
after the leaving step, a post-leaving voltage measuring step of measuring a post-leaving device voltage of the power storage device, wherein the post-leaving device voltage is a voltage of the power storage device after the power storage device has been left standstill in the leaving step;
an actually measuring step of obtaining an actual measured voltage drop rate of the power storage device between the pre-leaving device voltage and the post-leaving device voltage;
an estimating step of estimating an estimated voltage drop rate to be generated in the power storage device according to
an elapsed time from completion of voltage adjustment in the voltage adjusting step until start of measurement of the pre-leaving device voltage in the pre-leaving voltage measuring step, and
the leaving period;
after the estimating step, a short-circuit determining step of determining whether or not the power storage device is short-circuited, based on the actual measured voltage drop rate and the estimated voltage drop rate; and
an eliminating step of eliminating the power storage device that is determined to be short-circuited in the short-circuit determining step.

2. The power storage device inspecting method according to claim 1, wherein
the power storage device is one among a plurality of power storage devices,

the power storage device inspecting method further comprises:

after the voltage adjusting step but before the pre-leaving voltage measuring step, a restraining step of restraining, by a restraining member, the plurality of power storage devices each having been adjusted to the first device voltage, while the power storage devices are electrically unconnected to each other, to constitute a restrained-device module including a plurality of restrained devices which are the power storage devices restrained by the restraining member, and the pre-leaving voltage measuring step, the leaving step, and the post-leaving voltage measuring step are performed on the restrained devices included in the restrained-device module.

3. A connected restrained-device module manufacturing method, comprising:

a short-circuit inspecting step of inspecting, by the power storage device inspecting method according to claim 2, whether or not each of restrained devices included in a restrained-device module is short-circuited; and

a connecting step of electrically connecting the restrained devices included in the restrained-device module to each other, in response to the short-circuit inspecting step determining that all of the restrained devices included in the restrained-device module are not short-circuited.

4. The connected restrained-device module manufacturing method according to claim 3, further comprising:

a removing step of removing at least one restrained device, that has been determined to be short-circuited in the short-circuit inspecting step, from among the restrained devices included in the restrained-device module; and a re-restraining step of reconstituting the restrained-device module from (a) remaining restrained devices, that have been determined not to be short-circuited in the short-circuit inspecting step, together with (b) a supplementary power storage device, the supplementary power storage device having been included in another restrained-device module and determined not to be short-circuited.

* * * * *